United States Patent
Baba

(10) Patent No.: US 7,233,255 B2
(45) Date of Patent: Jun. 19, 2007

(54) INDICATING INSTRUMENT

(75) Inventor: Takeshi Baba, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 166 days.

(21) Appl. No.: 11/057,253

(22) Filed: Feb. 15, 2005

(65) Prior Publication Data

US 2006/0010977 A1    Jan. 19, 2006

(30) Foreign Application Priority Data

Feb. 27, 2004  (JP) ............................. 2004-053830

(51) Int. Cl.
*G08B 21/00* (2006.01)

(52) U.S. Cl. ...................................... 340/688; 340/438

(58) Field of Classification Search ................ 340/688, 340/438, 439, 457; 318/696, 490
See application file for complete search history.

(56) References Cited

U.S. PATENT DOCUMENTS 6,677,723 B2 *   1/2004   Shimazaki ................ 318/696

FOREIGN PATENT DOCUMENTS

| EP | 0 756 175 A1 | 1/1997 |
| EP | 1 143 600 A1 | 10/2001 |
| EP | 1 195 610 A1 | 4/2002 |
| JP | 2001-314099 A | 11/2001 |
| JP | 2002-250641 A | 9/2002 |

* cited by examiner

*Primary Examiner*—Daryl C Pope
(74) *Attorney, Agent, or Firm*—Foley & Lardner LLP

(57) ABSTRACT

An indicating instrument includes an indicating needle provided in an instrument board, a stopper device to define a turning start position and a returning position of the indicating needle, a stepping motor for driving the indicating needle, and a control device to control the stepping motor; the control device outputs a zero reset signal for returning the indicating needle to the stopper device and a signal for moving the indicating needle away from the stopper device to the stepping motor when the stepping motor is turned on or turned off to carry out a missed step reset processing.

3 Claims, 6 Drawing Sheets

INDICATING INSTRUMENT

CROSS-REFERENCE TO THE RELATED APPLICATION

This application claims the priority benefit of Japanese Patent Application No. 2004-53830, filed on Feb. 27, 2004, the entire descriptions of which are incorporated herein by reference.

BACKGROUND OF THE INVENTION

1. Field of the Invention

The present invention relates to an indicating instrument for driving an indicating needle by a stepping motor.

2. Related Art Statement

Conventionally, by way of an example, a stepping motor has been used as a source of power for turning an indicating needle of an instrument board and so on of an automobile and the like. The stepping motor is configured such that the rotation of the stepping motor is transferred to the indicating needle by using a reduction gear, and then the indicating needle indicates vehicle speed, engine revolution, and so on.

However, such a stepping motor may produces missed steps by various reasons. As a device for carrying out a missed step reset, a stopper projection is provided in the indication board on which the stepping motor is mounted. The stopper projection is provided in a position where the indicating needle of the indicating board starts the turning. When the stepping motor produces the missed steps, the indicating needle is returned to the stopper projection side by outputting a zero reset signal to the stepping motor, and when the indicating needle comes into contact with the stopper projection, it is determined that the missed step reset is completed, then the zero reset signal is stopped (reference to Japanese Patent Laid Open Nos. 2001-314099, 2002-250641).

However, regarding conventional stepping motor control for an indicating instrument, when the indicating needle comes into contact with the stopper projection, the processing of missed step reset is completed by stopping the output of the zero reset signal with a state that the indicating needle is pressed onto the stopper projection. Therefore, when the reduction gear includes the allowance in a stopped position, there may be a case that an appropriate position which should be originally stopped is deviated by the allowance of the gear with the backlash of the reduction gear; even after the missed step is eliminated, there was a case that the indicating needle did not indicate an appropriate position.

SUMMARY OF THE INVENTION

The present invention has been made in view of the above problem. It is, therefore, an object of the present invention to provide an indicating instrument capable of performing a missed step reset by returning the indicating needle to an appropriate initial position even though there are factors such as backlash and deformation of a gear when returning the indicating needle to the initial position by a zero reset signal in case of missed steps of a stepping motor.

According to the indicating instrument of the present invention, it comprises an indicating needle provided in an instrument board, a stopper device to define a turning start position and a returning position of the indicating needle, a stepping motor for driving the indicating needle, and a control device to control the stepping motor, and the control device outputs a zero reset signal for returning the indicating needle to the stopper device and a signal for moving the indicating needle away from the stopper device to the stepping motor when the stepping motor is turned on or turned off to carry out a missed step reset processing.

According to the indicating instrument of the present invention, the missed step reset processing alternately outputs the zero reset signal and the signal for moving the indicating needle away from the stopper device to the stepping motor one or more times to set an initial angle position in which the indicating needle is moved away from the stopper device by a predetermined angle in a direction moving away from zero.

DETAILED DESCRIPTION OF THE PREFERRED EMBODIMENT

Hereinafter, an embodiment for carrying out the invention will be described.

Figure 1:
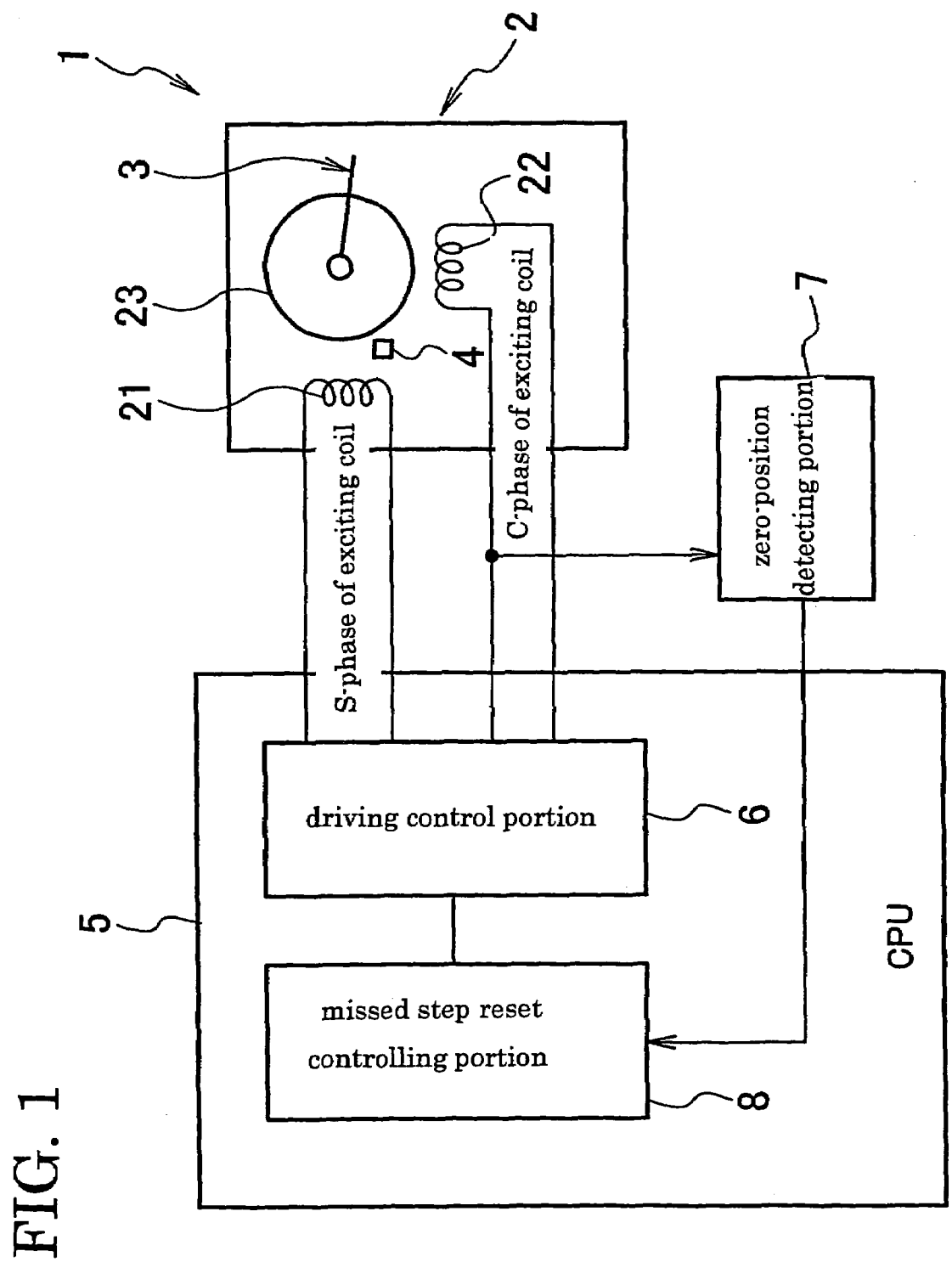
FIG. 1 is a block diagram for carrying out a missed step reset processing of an indicating instrument.

FIG. 1 is a view illustrating a schematic structure and a block structure of an indicating instrument according to an embodiment of the present invention.

In this embodiment, a speed meter for a vehicle will be explained as an indicating instrument. The indicating instrument 1 comprises a 2 phase type stepping motor 2, an indicating needle 3 to be turned through a reduction gear mechanism (not shown), a stopper mechanism 4 (stopper device) to stop the turning of the indicating needle 3, a CPU portion 5, and a zero-position detecting portion 7.

The indicating instrument 1 operates by receiving power supply from a battery (not shown). The CPU portion 5 comprises a power supply circuit, etc., to be connected to a battery. When an automobile key is in a running state and a running standby state from the start of traveling to the end of traveling, the CPU portion 5 drives the stepping motor 2 based on the outputs detected from a vehicle speed sensor (not shown), and then turns the indicating needle 3 to a scale position indicating a vehicle speed of a not shown dial plate (instrument plate).

The stepping motor 2 comprises a stator (not shown) having S-phase coil (field coil) 21 and C-phase coil (field coil) 22, and a magnetic rotor 23. A lot of north poles and south poles are alternately magnetized on the outer circumference surface of the magnetic rotor 23. The rotation of the magnetic rotor 23 is transmitted to a reduction gear mechanism (not shown), and then the indicating needle 3 turns along the rotation of the reduction gear mechanism.

The stopper mechanism 4 is constructed to prevent the indicating needle 3 from turning in the zero-returning direction by the contact of the indicating needle 3 to a projection provided on the dial plate. With the state that the turning of the indicating needle 3 in the zero-returning direction is prevented by the stopper mechanism 4, the rotation of the reduction gear mechanism and the magnetic rotor 23 is also prevented.

The CPU portion 5 is constructed by using a microcomputer and a peripheral circuit. The CPU portion 5 comprises a driving control portion 6, a missed step reset controlling portion 8, and a zero reset determining device 73 constituting a part of the zero-position detecting portion 7. A vehicle speed indicating control device 61 and a PWM signal generating device 62 of the driving control portion 6, the missed step reset controlling portion 8, and the zero reset determining device 73 constituting a part of the zero position detecting portion 7 are constructed by programs.

The driving control portion 6 is connected with ports P1, P2 connected to the both end portions of S-phase coil 21 of the stepping motor 2, and ports P3, P4 connected to the both end portions of C-phase coil 22 of the stepping motor 2. One end portion of the C-phase coil 22 is connected with an induced voltage detecting circuit 70 constituting the zero-position detecting portion 7.

Figure 2:
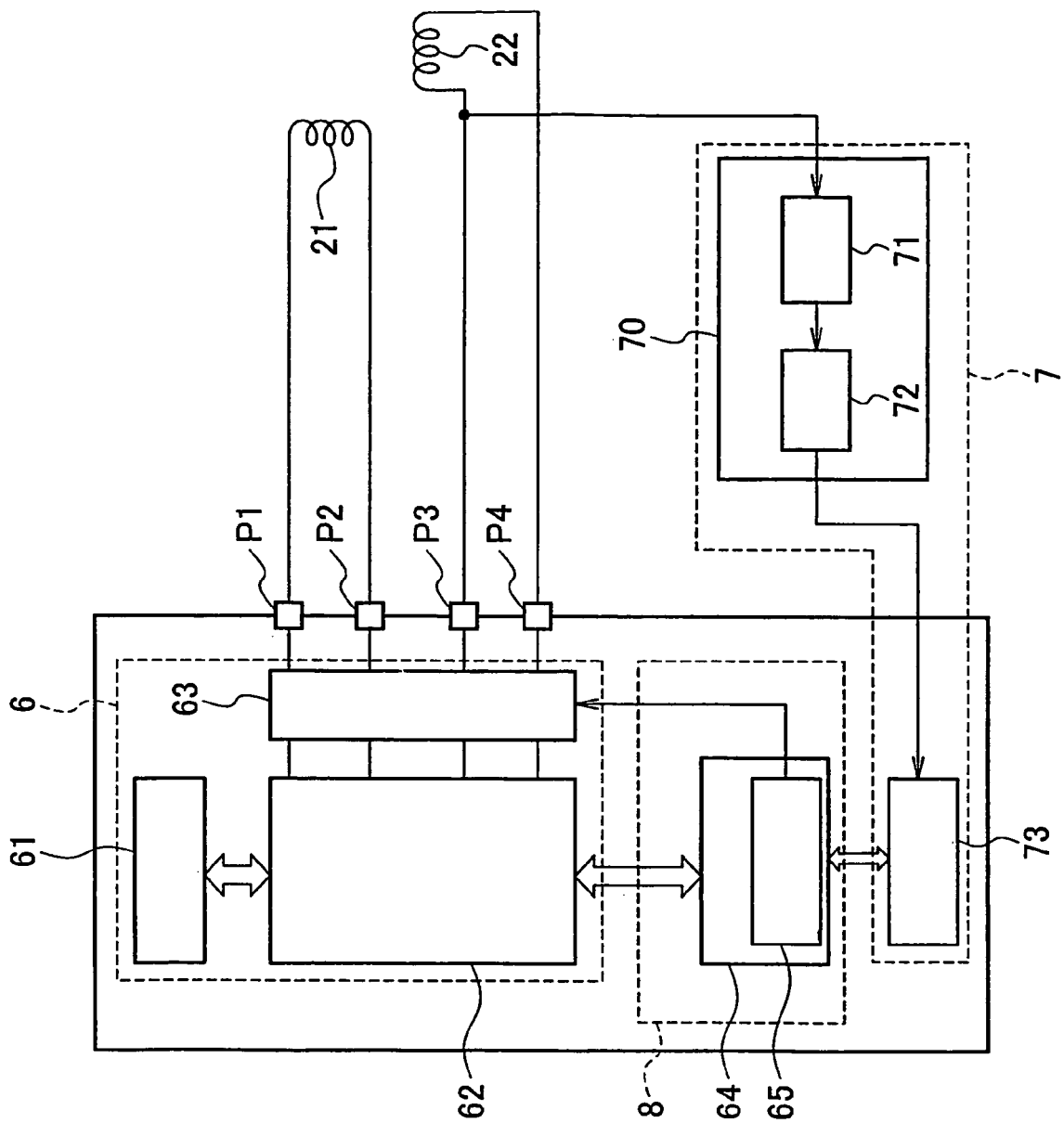
FIG. 2 is a block diagram specifically showing the block diagram in FIG. 1.

FIG. 2 shows the constructions of the driving control portion 6, the zero-position detecting portion 7, and the missed step reset controlling portion 8.

The driving control portion 6 comprises the vehicle speed indicating control device 61 to which an electric signal indicating a vehicle speed is input from a vehicle speed sensor (not shown) provided in a vehicle body, the PWM signal generating device 62 for generating a PWM signal by a vehicle speed data signal from the vehicle speed indicating control device 61, and an output circuit 63 for supplying induced current to the S-phase coil 21 or the C-phase coil 22 by the output of the PWM signal generating device 62.

With on-state of an ignition switch, the vehicle speed indicating control device 61 calculates a turning direction and a turning angle of the indicating needle 3 based on a vehicle speed signal supplied from the vehicle speed sensor, and then outputs the vehicle speed data signal to the PWM signal generating device 62. The PWM signal generating device 62 generates a PWM signal based on the output signal from the vehicle speed indicating control device 61, and then outputs the PWM signal to the output circuit 63. The output circuit 63 drives the stepping motor 2 based on the PWM signal, and turns the indicating needle 3 to a dial position corresponding to a vehicle speed of the above dial plate.

The PWM signal generating device 62 generates respective PWM signals, which supply current from one end of the S-phase coil 21 to the other end of the S-phase coil 21 (positive direction) or from the other end of the S-phase coil 21 to one end of the S-phase coil 21 (opposite direction), and respective PWM signals, which supply current from one end of the C-phase coil 22 to the other end of the C-phase coil 22 (positive direction) or from the other end of the C-phase coil 22 to one end of the C-phase coil 22 (opposite direction). The 4 systems of the PWM signals generated by the PWM signal generating device 62 are supplied to the respective output ports P1 to P4 through the output circuit 63.

The output circuit 63 comprises a known protection circuit such as a switching element and diode of a transistor, etc., which outputs current for driving the S-phase coil 21 and the C-phase coil 22 in a predetermined order from a emitter or a collector by the PWM signal supplied from the PWM signal generating device 62 to a base.

When the indicating needle 3 turns in the direction moving away from the stopper mechanism 4, respective PWM signals are generated and output in a direction in which an electric angle of the stepping motor increases. When the indicating needle 3 turns in the zero-returning direction, respective PWM signals are generated and output in a direction in which the electric angle decreases.

When supplying the positive direction current to the S-phase coil 21, pulse current flows from the output port P1 to the output port P2 through the S-phase coil 21. When supplying the opposite direction current to the S-phase coil, the pulse current flows from the output port P2 to the output port P1 through the S-phase coil.

When supplying the positive direction current to the C-phase coil 22, pulse current flows from the output port P3 to the output port P4 through the C-phase coil 22. When supplying the negative direction current to the C-phase coil 22, the pulse current flows from the output port P4 to the output port P3 through the C-phase coil 22. The exciting current flowing the S-phase coil 21 and the pulse current flowing the C-phase coil 22 are expressed as pseudo Sin-curve and Cos-curve for a direction and acceleration and slow down processing of the current flowing the coils.

The output circuit 63 enables the output ports P1 to P4 to be open (high impedance) states by turning off the respective switching elements.

The zero-position detecting portion 7 comprises an induced voltage detecting circuit 70 and the zero reset determining device 73 of the CPU portion 5.

The induced voltage detecting circuit 70 is adopted to detect that the indicating needle 3 has returned to the zero reset position (zero-position). The induced voltage detecting circuit 70 comprises a filter circuit 71 having a low-pass characteristic for reducing and eliminating high-frequency noise element superimposed on the induced voltage induced in the C-phase coil 22, and a voltage comparator 72 to generate binary output by comparing the induced voltage and previously set threshold voltage. The binary output of the voltage comparator 72 is input to the zero reset determining device 73 in the CPU portion 5 through an input port.

The zero reset determining device 73 shown in FIG. 2 detects that the rotation of the magnetic rotor 23 has been stopped based on the output of the voltage comparator 72, thus, the zero reset determining device 73 determines that the indicating needle 3 has returned to the zero (reference) position.

The missed step reset controlling portion 8 comprises the zero reset processing device 64 shown in FIG. 2. When the ignition switch is turned off, the zero reset processing device 64 carries out a zero reset processing enabling the indicating needle 3 to return to the zero (reference) position and a missed step reset processing. Moreover, when the ignition switch is turned on, the zero reset processing device 64 performs the zero reset processing enabling the indicating needle 3 to return to the zero (reference) position once and the missed step reset processing, and then allows the indicating needle 3 to be drivable in the direction moving away from the zero position.

The zero reset processing device 64 comprises an output port opening control device 65 for controlling one end of the C-phase coil 22 to be the open state. In case of performing the missed step reset processing, the output port opening control device 65 waits for the output of the zero reset determining device 73.

The zero reset determining device 73 is adopted to determine the zero reset of the indicting needle 3 to the zero position, where the indicating needle 3 stops by the contact to the stopper mechanism 4, in corporation with the output port opening control device 65 of the missed step reset control portion 8. When starting the zero reset processing, the zero reset determining device 73 loads the output of the voltage comparator 72 in time just before stopping the opening of the output port P3 by the instruction from the zero reset processing device 64. If the output of the comparator 72 is H level, the zero reset determining device 73 determines that the indicating needle 3 has not returned to the zero reset position yet. If the output of the comparator 72 is L level, the zero reset determining device 73 determines that the indicating needle 3 has returned to the zero reset position. With the zero reset processing, the turning of the indicating needle 3 is stopped by the stopper mechanism 4. With the state that the turning of the magnetic rotor 23 is stopped, the induced voltage does not generate in the C-phase coil 22, so that the output of the voltage comparator 72 becomes L level.

Figure 6:
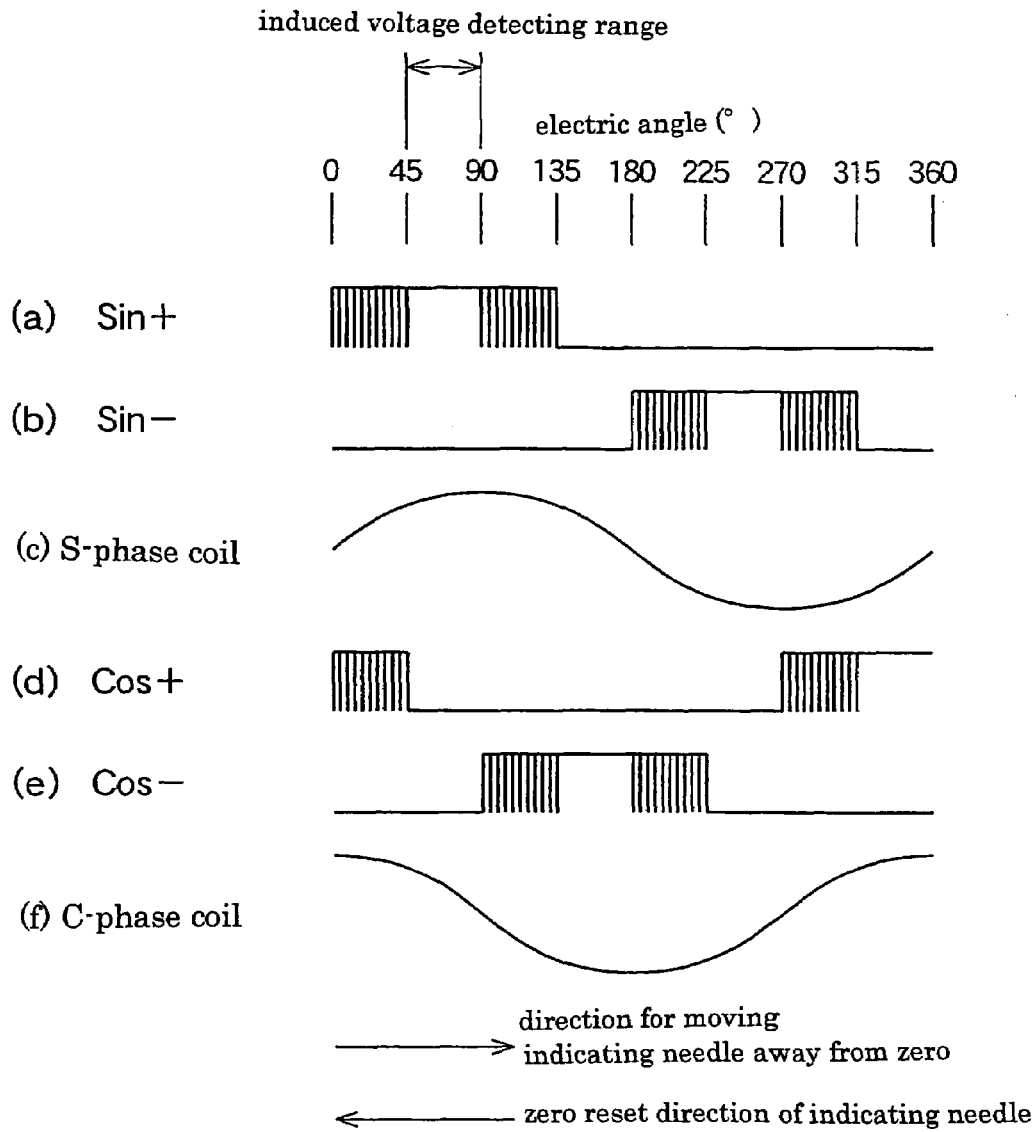
FIG. 6 is an explanation view illustrating a state that a PWM signal, pseudo-Sin signal and pseudo-Cos signal supplied to S-phase coil and C-phase coil are changed in accordance with an electric angle.

In other words, as illustrated in FIG. 6, when the electric angle of the pseudo Sin+curve flowing the S-phase coil 21 is from 45° to 90° and from 225° to 270°, the pulse current dose not flow in the C-phase coil 22; however, the induced current generates in the C-phase coil 22 by the rotation of the magnetic rotor 23. Here, the voltage comparator 72 compares the induced voltage induced to the C-phase coil 22 at this point and the threshold. When the induced voltage is higher than the threshold voltage, it is determined that the magnetic rotor 23 rotates and the indicating needle 3 is turning, and then the zero reset processing is continued.

In the zero reset processing, the zero reset processing device 64 drives the stepping motor 2 in the direction that the indicating needle 3 is returned to the stopper mechanism 4 side as the first step, and enables the output port P3 of Cos+side to be the open (high impedance) state at the right time outputting the PWM signal of Sin+side as the second step. As the third step, the zero reset determining device 73 loads the detected output of induced voltage (the output of the voltage comparator 72) from the voltage comparator 72. As the fourth step, if the logical level is the H level, the zero reset determining device 73 determines that the indicating needle 3 is turning, and sets back the output port P3 of Cos+side to be the output state of the PWM signal, and then continues the driving of the indicating needle to the zero reset direction. In the fourth step, if the detected output of induced voltage (the output of the voltage comparator 72) is L level lower than the threshold, the zero reset determining device 73 determines that the indicating needle is returned to the zero position, and sets back the output port P3 of Cos+side to be the output state of the PWM signal, and then stops the driving of the stepping motor.

Moreover, in the last half of the opening period of the output port P3, the zero reset determining device 73 can load the output of the voltage comparator 72 for more than once with a predetermined time interval.

In the missed step reset processing of this embodiment, the missed step reset processing is carried out by performing the zero reset processing more than once to eliminate the triggers for the missed steps such as the backlash and deformation of the reduction gear.

Figure 3:
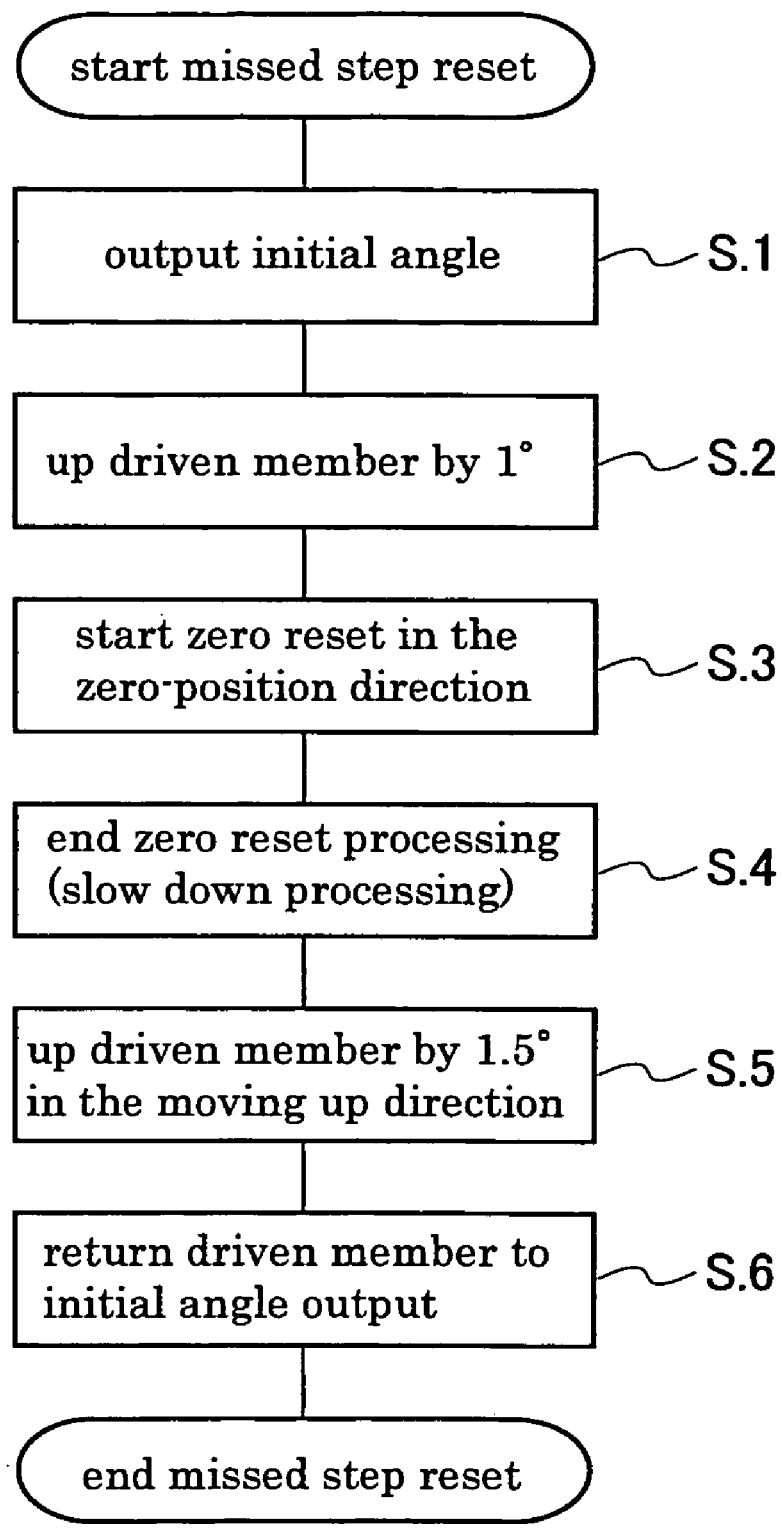
FIG. 3 is a view showing a flow of the steps of the missed step processing.
Figure 4:
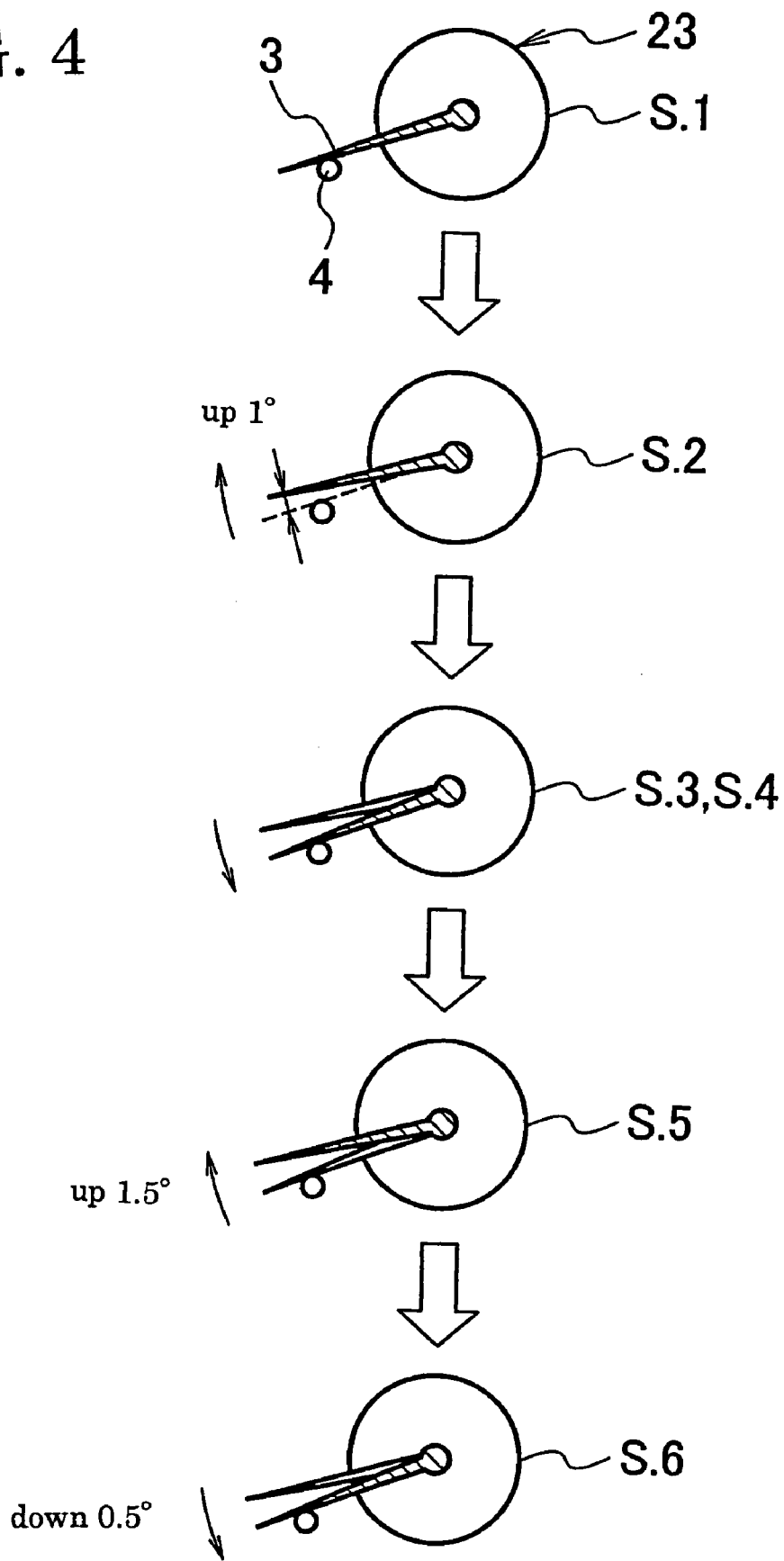
FIG. 4 is an explanation view illustrating movement of an indicating needle in the missed step reset processing of FIG. 3.
Figure 5:
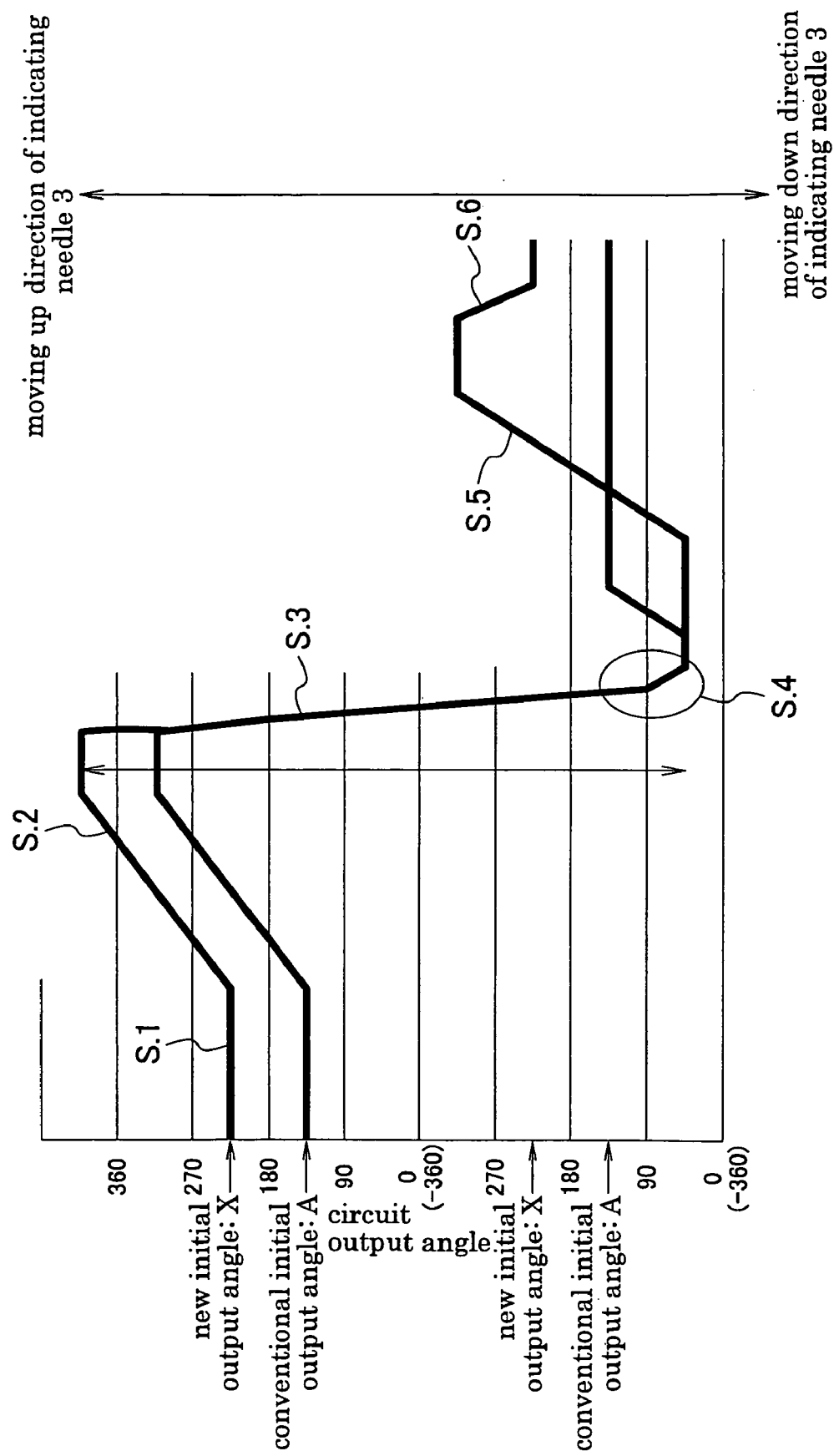
FIG. 5 is an explanation view showing changes in an electric angle in the missed step reset of FIGS. 3, 4.

FIGS. 3,4 indicates the flow of the missed step reset processing of the present invention, and FIG. 5 shows the changes in the electric angle at this point. Namely, when the ignition switch is turned on or tuned off, the missed step reset processing flag is started. In step S.1, an initial angle of the magnetic rotor 23 when the indicating needle 3 is in the position of the stopper mechanism 4 is output. In the step S.2, the S-phase coil 21 and the C-phase coil 22 are energized by the driving control portion 6 in order to turn the indicating needle 3 by substantially 1° (the first predetermined angle) of the mechanical angle in the direction moving away from the zero position (reference to FIG. 4). In the step S3, in order to return the indicating needle 3 to the stopper mechanism 4 side again, the S-phase coil 21 and the C-phase coil 22 are energized by the driving control portion 6 to start the zero reset. In the step S4, after the driving control portion 6 performs a slow down processing in the vicinity where the indicating needle 3 comes into contact with the stopper mechanism 4 in this zero reset processing (reference to FIG. 5), the zero reset processing is once completed at the point when the indicating needle 3 comes into contact with the stopper mechanism 4. In the next step S5, the S-phase coil 21 and the C-phase coil 22 are energized by the driving control portion 6 to move the indicating needle 3 away from the stopper mechanism 4 by 1.5° (the second predetermined angle) in the direction moving away from the zero. In the step S6, the zero reset processing is carried out such that the indicating needle 3 is again returned to the stopper mechanism 4 side by 0.5 degree (the third predetermined angle). Therefore, the missed step reset processing flag is completed.

In this missed step reset processing of this embodiment, at first, the initial angle is detected, secondly, the indicating needle 3 is turned by 1°, thirdly, the zero reset processing is performed such that the indicating needle 3 comes close to the stopper mechanism 4 side, fourthly, the processing for moving the indicating needle 3 away from the stopper mechanism 4 is again carried out such that the indicating needle 3 rises from the stopper mechanism 4 by 1.5°, and fifthly, the zero reset processing for returning the indicating needle 3 to the stopper mechanism 4 side by 0.5°, in other words, the missed step reset processing for setting an initial angle position where the indicating needle 3 is removed in the direction moving away from the zero by a predetermined angle is performed. Therefore, the triggers for the missed steps such as backlash and deformation of the reduction gear mechanism are eliminated, and the indicating needle 3 can be adjusted to indicate an appropriate speed. Moreover, the above first to third predetermined angles are the examples, thus, these angles are not limited the above.

In this embodiment, the example is shown that one end of the C-phase coil 22 is adopted to be the open state, and the C-phase coil 22 is used as the coil for detecting the induced voltage. However, one end of the S-phase coil 21 can be used to be the open state, and the induced voltage can be detected by the S-phase coil 21 side. In this case, one end of the S-phase coil 21 is set to be the open state at the right time when the S-phase coil 21 becomes a non-excited state. Accordingly, it is possible to determine whether the indicating needle 3 is turning or in the stopped state by detecting the induced voltage without having influence on the driving of the stepping motor 2.

The indicating instrument according to the present invention can always maintain an appropriate indicating needle by solving the triggers for the missed steps such as backlash and deformation of the reduction gear when conducting the missed step reset of the stepping motor used for the instrument board.

When the missed steps of the stepping motor is reset and when the indicating needle is returned to the initial angle setting position, the indicating instrument according to the present invention conducts the turning of the indicating needle with respect to the stopper device in the zero reset direction and in the direction moving away from the zero respectively one or more times. Accordingly, even though backlash, deformation and so on occur in the reduction gear between the indicating needle and the stepping motor, the indicating instrument of the present invention can eliminate these triggers, and enable the indicating needle to be in an appropriate initial angle.

What is claimed is:

1. An indicating instrument, comprising:
   an indicating needle provided in an instrument board;
   a stopper device to define a turning start position and a returning position of the indicating needle;
   a stepping motor for driving the indicating needle; and
   a control device to control the stepping motor, wherein the control device alternately outputs a zero reset signal for returning the indicating needle to the stopper device and a signal for moving the indicating needle away from the stopper device to the stepping motor one or more times when the stepping motor is turned on or turned off to carry out a missed step reset processing so as to set an initial angle position in which the indicating needle is moved away from the stopper device at a predetermined angle in a direction moving away from zero.

2. The indicating instrument according to claim 1, wherein when turning on or turning off the stepping motor, the indicating needle:
   rotates in the direction moving away from zero at a first predetermined angle in response to the signal for moving the indicating needle away from the stopper device output from the control device to the stepping motor;
   rotates toward a position, which has contact with the stopper device, in response to the zero reset signal for returning the indicating needle to the stopper device output from the control device to the stepping motor so as to solve a deformation of the gear of the stepping motor;
   again rotates in the direction moving away from zero at a second predetermined angle in response to the signal for moving the indicating needle away from the stopper device output from the control device to the stepping motor, and
   rotates toward the stopper device at a third predetermined angle in response to the zero reset signal output from the control device to the stepping motor so as to solve a backlash of the gear of the stepping motor,
   wherein a position rotated at the third predetermined angle by the zero reset signal is set to the initial angle position of the indicating needle.

3. A vehicle in which the indicating instrument as claimed in claim 1 is installed.

* * * * *